US006812577B2

(12) United States Patent
Lee

(10) Patent No.: US 6,812,577 B2
(45) Date of Patent: Nov. 2, 2004

(54) SEMICONDUCTOR CONTACT STRUCTURE HAVING WIDE LOWER PORTION EMBEDDED IN CONDUCTIVE MATERIAL

(75) Inventor: Seung-Whan Lee, Yongin-shi (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/419,896

(22) Filed: Apr. 22, 2003

(65) Prior Publication Data

US 2004/0046251 A1 Mar. 11, 2004

(30) Foreign Application Priority Data

Aug. 20, 2002 (KR) ................................ 10-2002-0049130

(51) Int. Cl.[7] ............................................. H01L 23/48
(52) U.S. Cl. ...................................... 257/774; 257/775
(58) Field of Search ................................. 257/774–775, 257/382–383

(56) References Cited

U.S. PATENT DOCUMENTS 5,470,790 A * 11/1995 Myers et al. ............... 438/625
6,576,547 B2 * 6/2003 Li ............................... 438/637
6,583,052 B2 * 6/2003 Shin et al. .................. 438/630

FOREIGN PATENT DOCUMENTS

KR    2001-0011196    2/2001

* cited by examiner

*Primary Examiner*—Thanh Nguyen
(74) *Attorney, Agent, or Firm*—Volentine Francos, PLLC

(57) ABSTRACT

The present invention provides a semiconductor contact structure and a method of forming the same. An interlayer dielectric is patterned to form a contact hole that exposes a predetermined region of conductive material on a semiconductor substrate. A recess is formed in the conductive material exposed by the contact hole and undercuts the walls that define the sides of the contact hole such that the recess is wider than the contact hole. A contact plug fills the recess as well as the contact hole. The contact plug is maintained in position stably atop the underlying conductive material because the lower part of the contact plug is wider than the upper part of the contact plug. Accordingly, the contact plug will not fall over even if the interlayer dielectric reflows during a subsequent process.

5 Claims, 8 Drawing Sheets

SEMICONDUCTOR CONTACT STRUCTURE HAVING WIDE LOWER PORTION EMBEDDED IN CONDUCTIVE MATERIAL

BACKGROUND OF THE INVENTION

1. Field of the Invention

The present invention relates to the structure of a semiconductor device and to a method of forming the same. More particularly, the present invention is directed to a contact structure of a semiconductor device and to a method of forming the same.

2. Description of the Related Art

As semiconductor devices become more highly integrated, the space between word lines and the space between interconnections of the devices are becoming more and more narrow. Accordingly, when an interlayer dielectric is formed for isolation between the word lines and between the interconnections, a void may be formed in the interlayer dielectric between the word lines and between the interconnections. Thus, in order to prevent the void from being formed in the interlayer dielectric, the interlayer dielectric is formed by a chemical vapor deposition (CVD) method, and then a reflow process is performed. When the reflow process is carried out with respect to the interlayer dielectric, a low temperature of 900° C. or less is required in order to prevent an excessive diffusion of impurities at an impurity diffusion region. Accordingly, a borophosphosilicate glass (BPSG) is used as the interlayer dielectric, because the BPSG can reflow at the low temperature of 900° C. or less.

FIGS. 1A and 1B show semiconductor contact structures and a conventional problem in the forming thereof.

Referring to FIGS. 1A and 1B, a lower layer 3 is stacked on a semiconductor substrate 1. A pad 5 of polysilicon doped with phosphorus is formed on the lower layer 3, and then a first interlayer dielectric (ILD) 7 of the BPSG is formed over the pad 5. The reflow process is performed with respect to the first ILD 7. The first ILD 7 is patterned to form a contact hole exposing an upper part of the pad 5. The contact hole is filled with the doped polysilicon and the resultant structure is planarized by a chemical mechanical polishing (CMP) process to form a contact plug 9. A nitride layer 11 is stacked on the planarized surface so as to cover the contact plug 9. Thereafter, a second ILD 13 is stacked on the resultant structure. The second ILD 13 is formed of BPSG. The reflow process is performed with respect to the second ILD 13. At this time, the first ILD 7 formed of the same BPSG also reflows. Thus, as illustrated in FIG. 1B, the contact plug 9 falls over due to a slight movement in the BSPG of the first ILD 7. As a consequence, the contact plug 9 may lift off the pad 5, resulting in a contact failure between the contact plug 9 and the pad 5. This phenomenon may occur whenever the contact plug is positioned in an interlayer dielectric formed of BPSG and a subsequent process is performed at a temperature that is high enough to cause the BPSG to reflow.

SUMMARY OF THE INVENTION

An object of the present invention is to provide a semiconductor contact structure having a contact plug that is stable atop the underlying material which the plug contacts. Likewise, another object of the present invention is to provide a method of forming a contact plug in an interlayer dielectric that prevents the contact plug from falling over even if the material of the interlayer dielectric reflows during a subsequent process.

To achieve these objects, the present invention provides a semiconductor contact structure comprising a contact plug having a lower part that is wider than an upper part thereof, and a method of manufacturing the same.

More specifically, the semiconductor contact structure includes an interlayer dielectric formed on a semiconductor substrate, a contact hole penetrating the interlayer dielectric to expose a predetermined region of material on the semiconductor substrate, and a recess formed in the material exposed by the contact hole. The interlayer dielectric may be formed of borophosphosilicate glass (BPSG). The recess includes an undercut region so as to be wider than the contact hole, and the contact plug fills the recess and the contact hole. The contact plug may be formed of polysilicon.

The method of forming the semiconductor contact structure includes the following steps. Firstly, a semiconductor substrate is prepared. An interlayer dielectric is formed on the semiconductor substrate. The interlayer dielectric is patterned to form a contact hole exposing a predetermined region of conductive material on the semiconductor substrate. The exposed material is isotropically etched to form a recess therein that is wider than the contact hole. The isotropic etching process may be performed using a mixture of oxygen ($O_2$), nitrogen trifluoride ($NF_3$) and helium (He). Thus, the recess undercuts the walls defining the sides of the contact hole. The recess and the contact hole are filled to form a contact plug.

The material exposed by the contact hole may be an impurity region formed at the surface of the semiconductor substrate. Alternatively, the material exposed by the contact hole may be a conductive pad formed on the semiconductor substrate. In this case, the conductive pad may be formed of polysilicon.

In addition, a spacer may be formed along the sides of the contact hole, The lower portion of the spacer extends below the level of the upper surface of the surface of the semiconductor substrate. In this case, the undercut formed by the recess is located beneath the upper surface of the semiconductor substrate.

DETAILED DESCRIPTION OF THE PREFERRED EMBODIMENTS

Figure 1A:
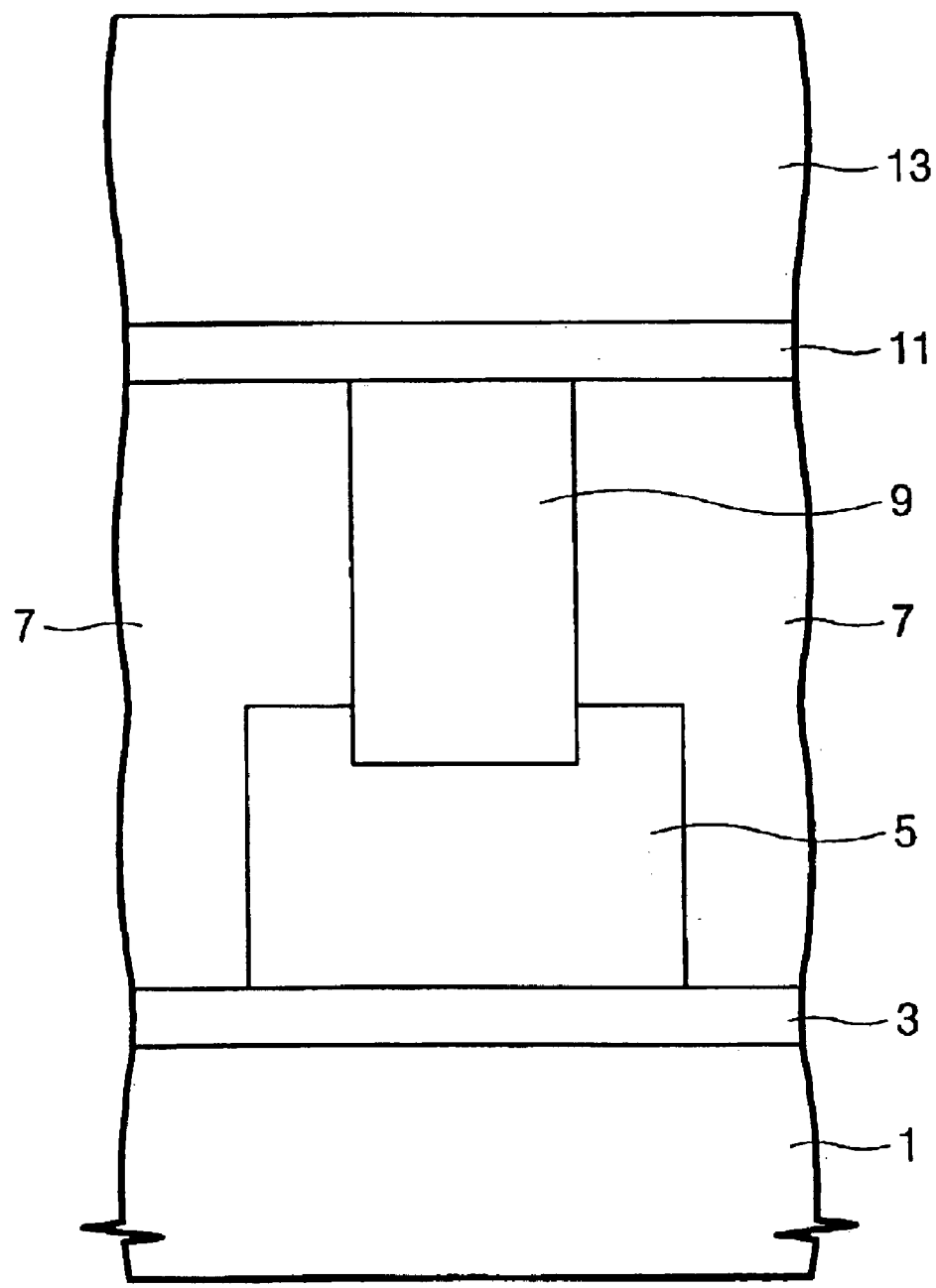
FIGS. 1A and 1B are cross-sectional views of conventional semiconductor contact structures.
Figure 1B:
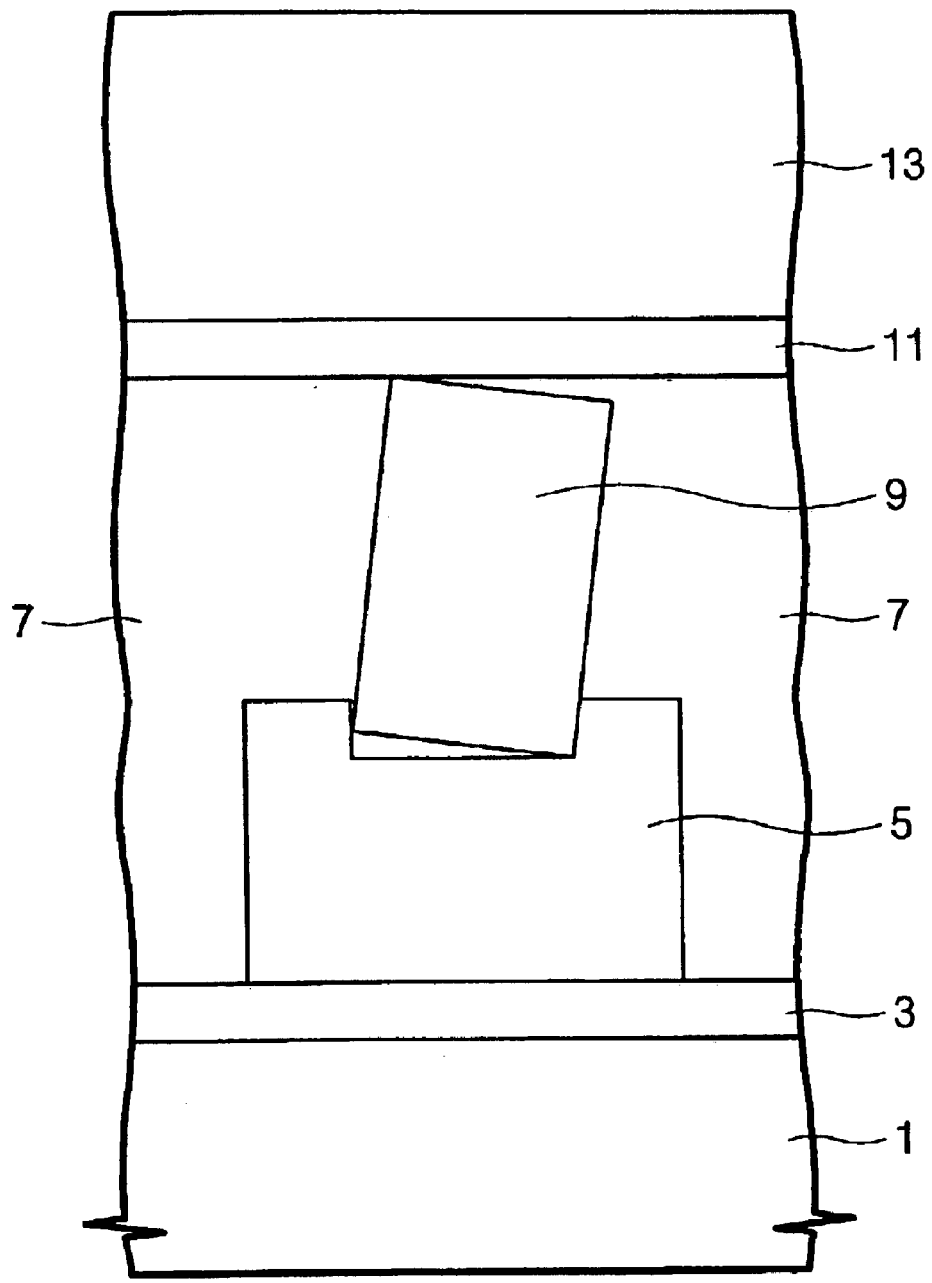

The present invention will now be described more fully hereinafter with reference to the accompanying drawings, in which preferred embodiments of the invention are shown. In the drawings, the thickness of layers and regions are exaggerated for clarity. Also, like reference numbers designate like elements throughout the drawings. Finally, it will also be understood that when a layer is referred to as being "on" another layer or substrate, such a description refers to the layer being disposed directly on the other layer or substrate, or intervening layers being present therebetween.

Figure 2A:
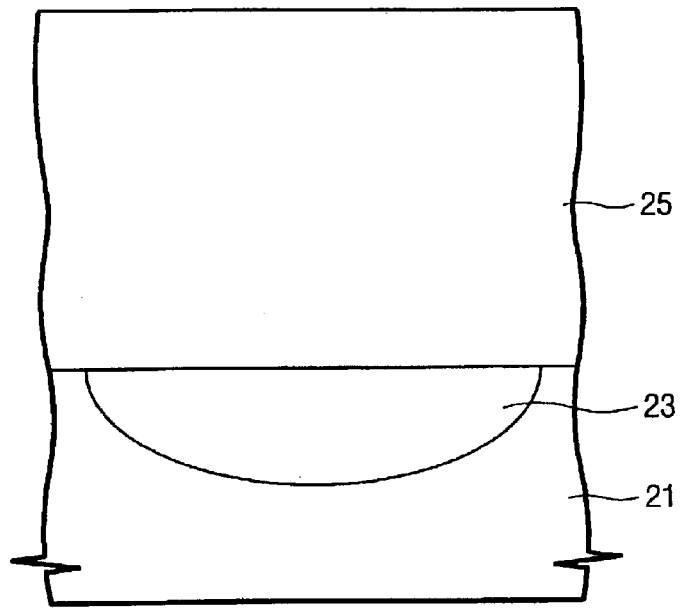
FIGS. 2A through 2D are cross-sectional views of a semiconductor structure showing the steps of a first preferred embodiment of a method of forming a semiconductor contact structure according to the present invention.

Referring first to FIG. 2A, impurities are doped at a surface of a semiconductor substrate 21 to form an impurity region 23. An interlayer dielectric (ILD) 25 is stacked on the semiconductor substrate 21. The ILD 25 is formed of an oxide and, preferably, of borophosphosilicate glass (BPSG).

Figure 2B:
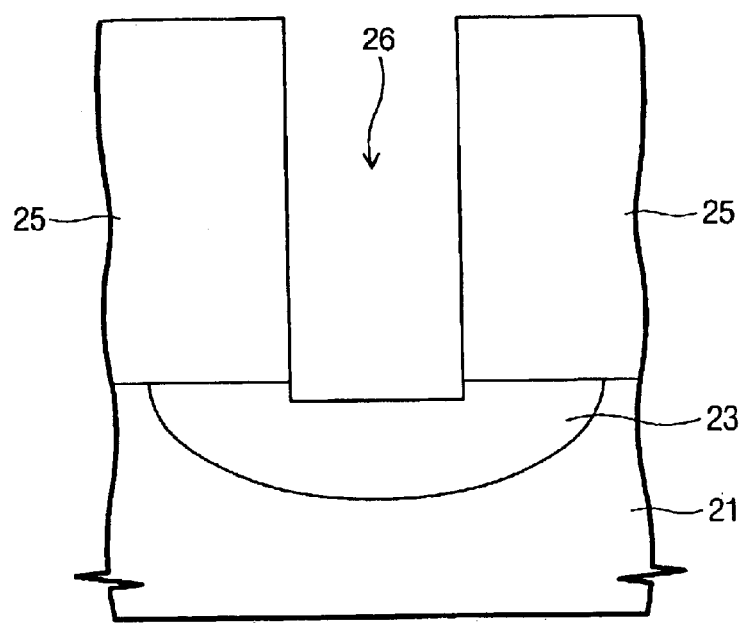

Referring to FIG. 2B, a predetermined region of the ILD 25 is patterned to form a contact hole 26 exposing an upper part of the impurity region 23. In this process, the upper portion of the impurity region 23 may be partially etched.

Figure 2C:
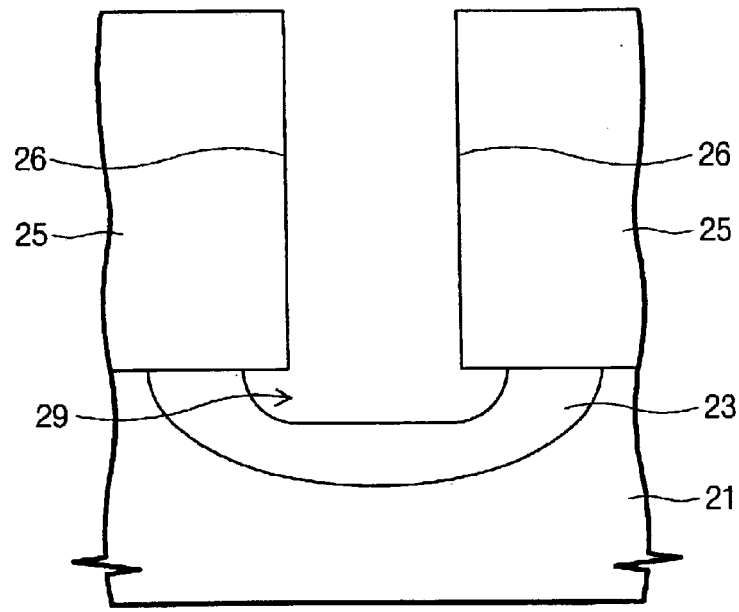

Referring to FIG. 2C, an isotropic dry etching process is performed with respect to the semiconductor substrate 21 having the contact hole 26 to form a recess 29 in the impurity region 23. The recess 29 may have an undercut region at the laterally outer peripheral thereof. That is, the recess 29 may undercut the ILD 25. The isotropic dry etching process may be carried out using a mixture of oxygen ($O_2$), nitrogen trifluoride ($NF_3$) and helium (He). For example, the isotropic dry etching process can be performed by supplying nitrogen trifluoride ($NF_3$) at a flow rate of 20 sccm, oxygen ($O_2$) at a flow rate of 200 sccm, and by using helium (He) as a carrier gas at a temperature of 40° C. and a pressure of 700 mTorr for 15 seconds.

Figure 2D:
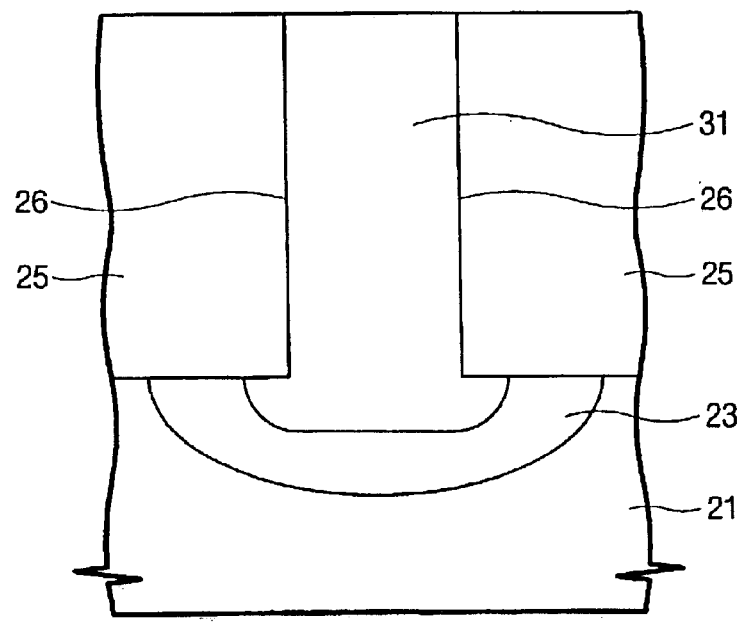

Referring to FIG. 2D, a conductive layer is formed over the entire surface of the semiconductor substrate 21 so as to fill the recess 29 and the contact hole 26. In the case wherein the impurity region 23 is an N-type region, polysilicon doped with phosphorous may be used for the conductive layer. A chemical mechanical polishing (CMP) process is performed on the conductive layer to form a contact plug 31.

Accordingly, the region of the structure at which the plug 31 contacts the impurity region 23 is stable because the lower part of the contact plug 31 is wider than the upper part thereof. Thus, the contact plug 31 will not fall over even if the ILD 25 reflows during a subsequent process.

Figure 2E:
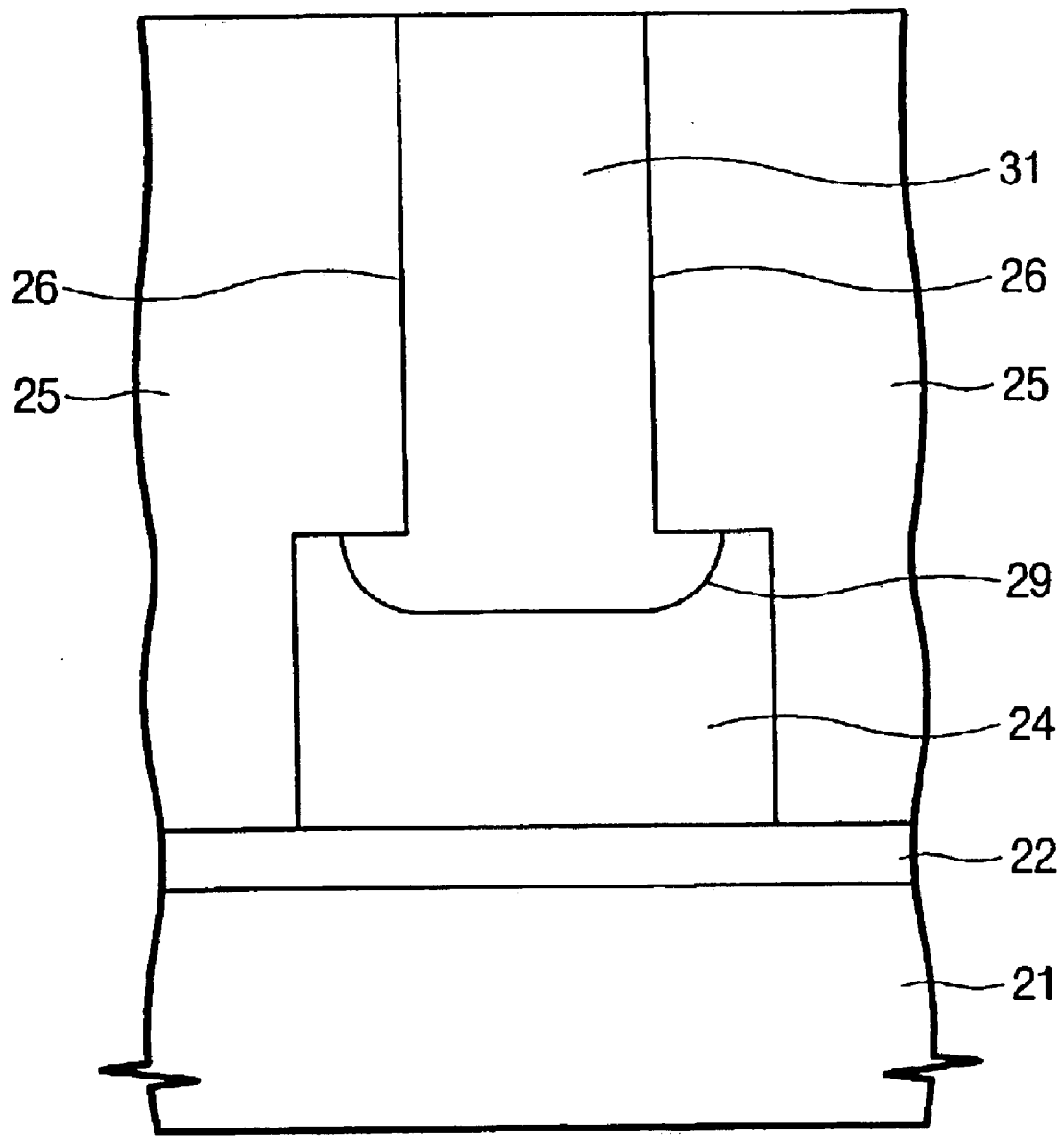
FIG. 2E is a cross-sectional view of another semiconductor structure showing a modification of the first preferred embodiment of the present invention.

In another form of the first embodiment, shown in FIG. 2E, a pad 24 and a lower layer 22 may be interposed between the contact plug 31 and the semiconductor substrate 21. The pad 24 may be preferably formed of polysilicon doped with phosphorous. The lower layer 22 may be an insulating layer such as an oxide layer. The recess 29 is formed in the pad 24 so as to undercut the ILD 25. The remaining steps are essentially the same as those described above.

Figure 3A:
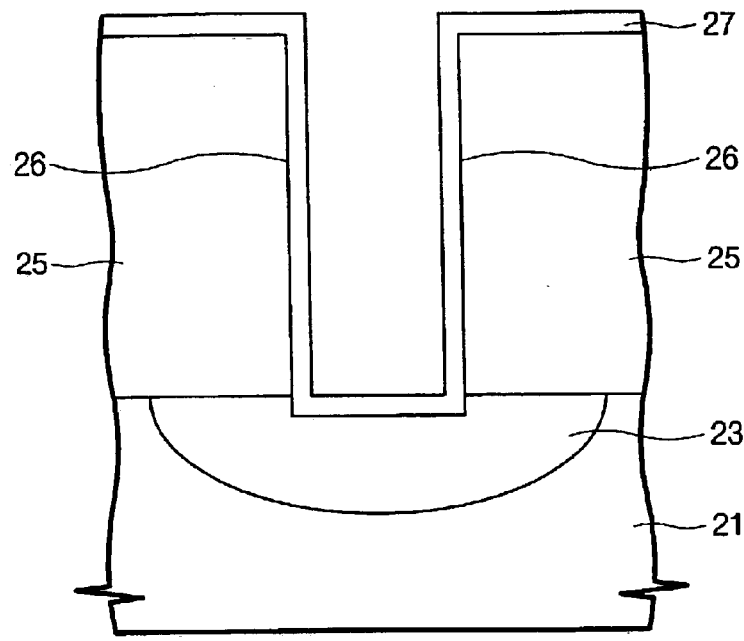
FIGS. 3A through 3D are cross-sectional views of a semiconductor structure showing the steps of a second preferred embodiment of a method of forming a semiconductor contact structure according to the present invention.

In the embodiment shown in FIGS. 3A through 3D, first, as shown in FIG. 3A, a silicon nitride layer 27 ($Si_3N_4$) is conformally stacked on the entire surface of the semiconductor substrate 21 once the contact hole 26 is formed.

Figure 3B:
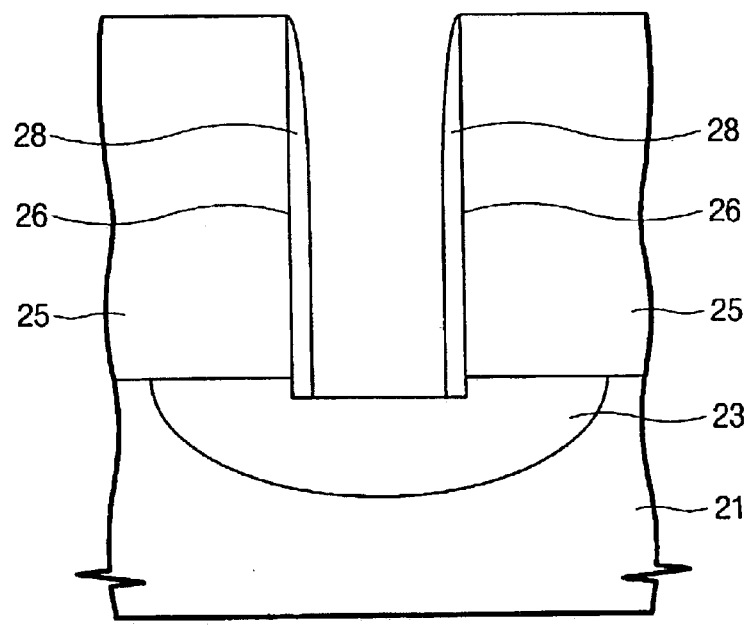

Referring to FIG. 3B, the silicon nitride layer 27 is anisotropically dry etched or etched back to form a spacer 28 covering inner sidewalls of the ILD that define the contact hole 26. The lowest part of the spacer 28 extends below the upper surface of the semiconductor substrate 21 because the upper part of the impurity region 23 has been etched similar to the case shown in and described with respect to FIG. 2B.

Figure 3C:
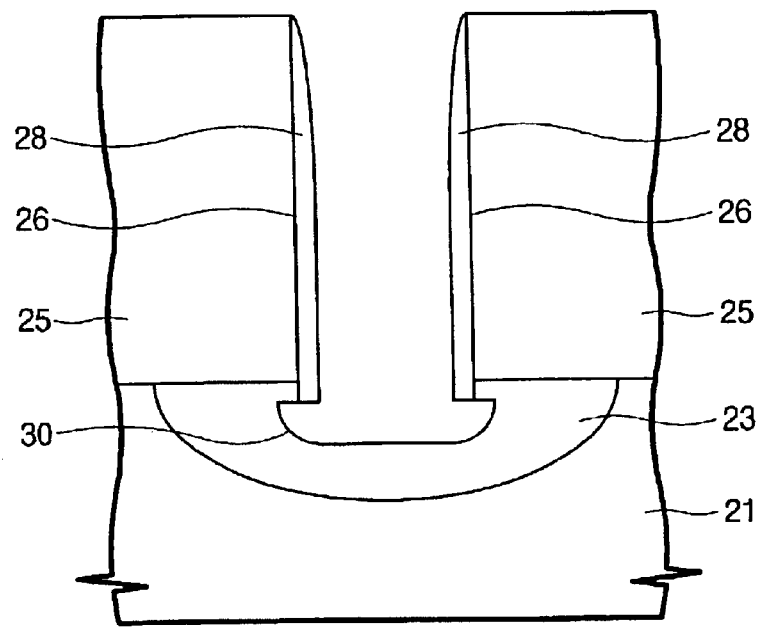

Referring to FIG. 3C, the exposed impurity region 23 is isotropically dry etched using the ILD 25 and the spacer 28 as an etch mask to form a recess 30 in the impurity region 23. The lateral portions of the recess 30 undercut the ILD 25. The undercut is formed below the upper surface of the semiconductor substrate 21 due to the fact that the lower part of the spacer 28 extends below the upper surface of the substrate 21.

Figure 3D:
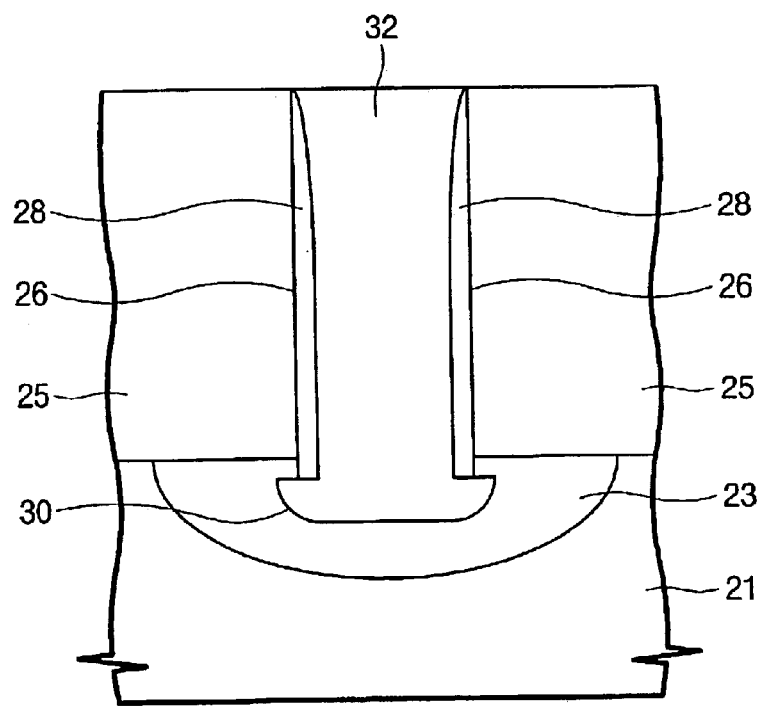

Referring to FIG. 3D, a conductive layer is stacked on the entire surface of the semiconductor substrate 21 provided with the recess 30 so as to fill the recess 30 and the contact hole 26. A CMP process is performed on the conductive layer to form a contact plug 32.

Thus, in the structure shown in FIG. 3D, the contact plug 32 has a protrusion embedded in the impurity region 23. The contact plug 32 will not fall over even if the ILD 25 subsequently reflows, because the contact portion of the plug 32 is wider than the upper portion thereof.

Figure 3E:
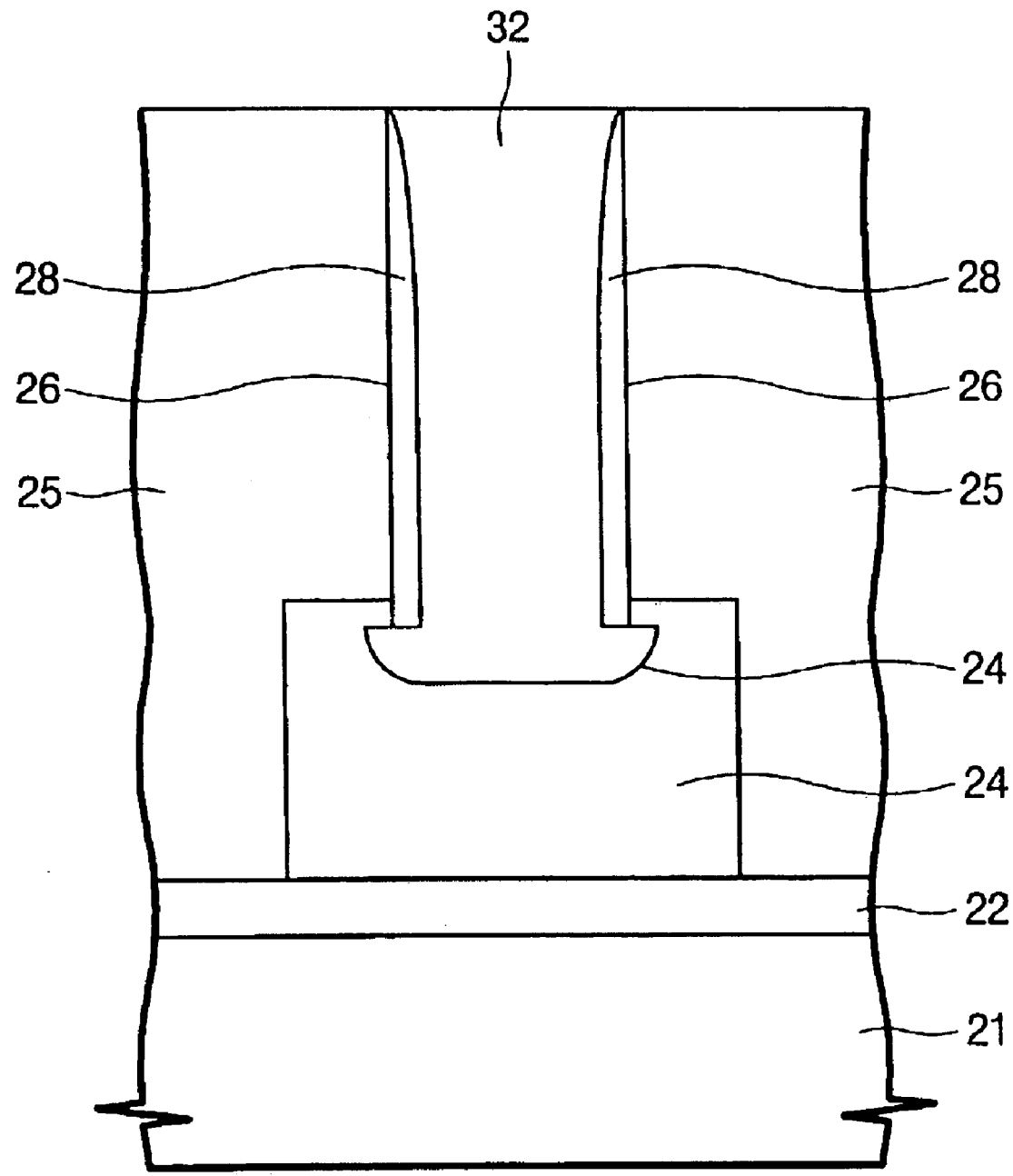
FIG. 3E is a cross-sectional view of another semiconductor structure showing a modification of the second preferred embodiment of the present invention.

In a modification of the second embodiment, shown in FIG. 3E, a pad 24 and a lower layer 22 may be interposed between the contact plug 32 and the semiconductor substrate 21. The pad 24 and the lower layer 22 are formed by using the same method as described in connection with the prior art and the embodiment shown in FIG. 3E. The remainder of the steps are similar to those described in connection with FIGS. 3A–3D and, therefore, a detailed description thereof will be omitted for the sake of brevity.

According to the present invention, the lower part of the contact plug is wider than the upper part of the contact plug. That is, the contact region where the plug contacts the underlying structure is relatively wide and stable. Therefore, the contact plug will not fall over even if the ILD through which the contact plug extends reflows during a subsequent process.

Although the present invention has been described in the drawings and specification in connection with the preferred embodiments thereof, the present invention is not so limited. Rather, various changes to and modifications of the preferred embodiments may be made within the true spirit and scope of the invention as defined by the following claims.

What is claimed is:

1. A semiconductor contact structure comprising:

a semiconductor substrate;

an interlayer dielectric layer disposed on said semiconductor substrate, said interlayer dielectric having a contact hole extending therethrough and exposing a region of conductive material on the semiconductor substrate, and said conductive material having an upper surface, and a recess therein contiguous to said contact hole, said recess being located below the upper surface of the conductive material and being wider than said contact hole as taken laterally in a direction extending along the upper surface of said substrate such that said recess undercuts sidewalls that define said contact hole;

a spacer lining the sidewalls that define said contact hole, said spacer having a lower portion that extends beneath the level of the upper surface of said conductive material; and a contact plug having a lower portion that rests directly on said conductive material and fills said recess, and an upper portion that fills said contact hole, whereby the lower portion of the contact plug is wider than the upper portion of thereof so that the contact plug is stably supported in the structure.

2. The semiconductor contact structure as claimed in claim 1, wherein said conductive material is a region of impurities comprising an upper portion of said substrate.

3. The semiconductor contact structure as claimed in claim 1, wherein said conductive material is a conductive pad disposed on the semiconductor substrate.

4. The semiconductor contact structure as claimed in claim 3, wherein the conductive pad comprises polysilicon.

5. The semiconductor contact structure as claimed in claim 1, wherein the interlayer dielectric layer is of borophosphsilscate glass (BPSG).

* * * * *